United States Patent [19]

Jaecklin

[11] 4,150,390
[45] Apr. 17, 1979

[54] THYRISTOR WITH GATE AND EMITTER SHUNTS DISTRIBUTED OVER THE CATHODE SURFACE

[75] Inventor: André Jaecklin, Ennetbaden, Switzerland

[73] Assignee: BBC Brown, Boveri & Company, Limited, Baden, Switzerland

[21] Appl. No.: 838,061

[22] Filed: Sep. 30, 1977

[30] Foreign Application Priority Data

Oct. 8, 1976 [CH] Switzerland ................ 12775/76

[51] Int. Cl.$^2$ ........................................ H01L 29/74
[52] U.S. Cl. ........................................ 357/38; 357/86
[58] Field of Search ........................... 357/38; 357/86

[56] References Cited

U.S. PATENT DOCUMENTS

| 3,476,992 | 11/1969 | Chu | 357/86 |
| 3,897,286 | 7/1975 | De Cecco et al. | 357/38 |

FOREIGN PATENT DOCUMENTS

| 1220894 | 1/1971 | United Kingdom | 357/38 |
| 1239067 | 7/1971 | United Kingdom | 357/38 |
| 1272154 | 4/1972 | United Kingdom | 357/38 |
| 1434905 | 5/1976 | United Kingdom | 357/38 |

OTHER PUBLICATIONS

A. Jaecklin, "The First Dynamic Phase at Turn–On of a Thyristor," IEEE Trans. on Elec. Dev., vol. ed-23 #8, Aug. 1976, pp. 940–944.

*Primary Examiner*—Joseph E. Clawson, Jr.
*Attorney, Agent, or Firm*—Oblon, Fisher, Spivak, McClelland & Maier

[57] ABSTRACT

A thyristor having a gate and emitter shunts distributed over a cathode surface, wherein those emitter shunts provided in the vicinity of the gate are separated by shorter distances than those emitter shunts which are present on the remainder of the cathode surface. The distances are in each case determined by measuring the distance from the center of one emitter short-circuit to the center of an adjacent emitter short-circuit.

5 Claims, 3 Drawing Figures

THYRISTOR WITH GATE AND EMITTER SHUNTS DISTRIBUTED OVER THE CATHODE SURFACE

BACKGROUND OF THE INVENTION

This invention relates to a thyristor with a gate and a plurality of emitter shunts distributed over the cathode surface and to the use of such a thyristor.

It is already known from J. Burtscher, E. Spenke "Kurzschlussemitter und Thyristorzundung" Siemens Forschungsund Entwicklungsberichte 3, pages 234–47 (1974) to suppress unwanted turn-on of a thyristor—particularly when a voltage age rise (du/dt) is applied—by means of more or less regularly distributed short-circuits (shunts) between n+ emitter and p-base. In addition, it is known to dispose this emitter shunt in the vicinity of the gate (turn-on electrode) to give it a special shape or to arrange it suitably in order to control the development of the turn-on front, as disclosed in Swiss Patent Specification No. 578,254 or to facilitate the propagation of the turn-on front as described in Swiss Patent Specification No. 572,279 or in the report by T. C. New, D. E. Cooper, "Turn-on characteristics of beam fired thyristors", IEEE Record IAS Conf. 8.-11.10.73, Milwaukee/Mich., pages 259–265. In this case, the emitter shunting serves the purpose of diverting a displacement current produced homogeneously over the whole thyristor area by the voltage rise (du/dt). If the emitter shunting is distributed substantially homogeneously over the cathode surface, a precisely defined proportion of this displacement current reaches each shunt in the interior of the cathode surface. Addition components of displacement current are lost at the emitter shunting at the cathode edges, however. Thus at the cathode edge at the gate side, for example, apart from the homogeneous displacement current, an additional displacement current produced under the gate also appears. As a result of this inhomogeneous distribution of the whole displacement current over the cross-sectional area of the thyristor, the voltage-rise (du/dt) resistance of the whole component is low. At the cathode edge the turn-on threshold is actually reached much earlier than in the interior of the cathode surface because of the localized increased displacement current there.

SUMMARY OF THE INVENTION

It is therefore the object of the invention to overcome the disadvantages of the known devices and to provide a thyristor which permits reliable control of the displacement current in critical regions so that destruction of the thyristor is prevented and assurance can be provided that in the event of steep voltage rises (du/dt) the turn-on threshold is not reached earlier at the cathode edges than within the cathode surface.

According to the present invention there is provided a thyristor having a gate and emitter shunts distributed over a cathode surface, wherein those emitter shunts provided in the vicinity of the gate are separated by shorter distances than those emitter shunts which are present on the remainder of the cathode surface.

The distances are in each case determined by measuring the distance from the center of one emitter short-circuit to the center of an adjacent emitter short-circuit.

Increased displacement current—in comparison with that flowing in the cathode surface—appearing in the vicinity of the gate when a voltage rise (du/dt) is applied, is compensated by these means and an improved constancy of turn-on of the thyristor is achieved even with steep voltage rises (du/dt).

It has proved favorable to select the separation of the emitter shunts provided in the vicinity of the gate about 1.5–5 times less than the separation of the emitter shunts distributed in the cathode surface. A particularly great voltage-rise resistance together with a homogeneous turn-on capacity is achieved by such a selection of the spacing.

It is also particularly advantageous for the spacing of the emitter shunts that are provided in the immediate vicinity of the gate, from the edge of the cathode surface adjacent the gate, to be selected so that this spacing corresponds substantially to the width of the first-turn-on channel appearing under normal turn-on conditions. A determination of the width of the turn-on channel may be effected, for example, in accordance with A. A. Jaecklin "The first dynamic phase at turn-on" IEEE Trans. Electron Devices, Ed-23 (Aug. 1976) by optical or electrical measuring methods, wherein this first-turn-on channel is defined as that part of the thyristor initially conducting current after the application of a firing signal to the thyristor gate, and wherein the width of the first-turn-on channel is controlled solely by the gate current resulting from the application of the firing signal. Thyristors with such a distribution of the emitter shunts over the cathode surface are distinguished, particularly with a spacing of the shunts from the cathode edge of about 100–500 $\mu$m, by the fact that the propagation of the turn-on front is only slightly hindered and therefore a particularly homogeneous turn-on capacity is assured.

An additional improvement in the turn-on capacity and in the voltage-rise strength can additionally be achieved, however, by the fact that the emitter shunts provided in the immediate vicinity of the gate are substantially equally spaced apart and that the spacing of the emitter shunts provided in the immediate vicinity of the gate from the edge of the cathode surface adjacent the gate is selected so that it amounts to at least half of the average distance apart of the emitter shunts provided in the immediate vicinity of the gate.

It also has a favorable effect on the turn-on performance and the voltage-rise strength if the emitter shunts present between the edge of the cathode remote from the gate and the emitter shunts disposed close to the gate are distributed homogeneously and uniformly over the cathode surface, and a further improvement in the thyristors from the point of view of the abovementioned characteristics is additionally achieved if it is arranged that the spacing between the emitter shunts present at the cathode edge remote from the gate is less than the spacing between the emitter shunts which are disposed between this and the emitter shunts provided in the vicinity of the gate.

Apart from this, it is also an advantage to give all the emitter shunts substantially the same shape, particularly a circular or polygonal shape, because as a result the displacement current is homogeneously compensated for and so the turn-on capacity and the voltage-rise strength are increased.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
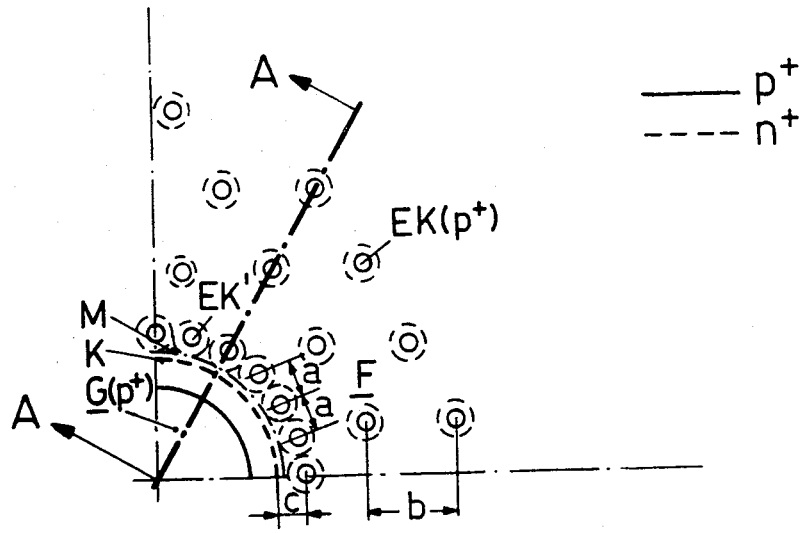
FIG. 1 shows a detail of a plan view of the gate area of a thyristor provided with a circular gate.

Referring now to the drawings, wherein like reference numerals designate identical or corresponding parts throughout the several views, and more particularly to FIG. 1 thereof, G is the gate (the turn-on electrode) in the form of a central, cylindrical region. This region is highly p-doped (p+). The gate is embedded in a p-doped (p) layer which is provided with a correspondingly formed recess. Then at some distance from the edge of the gate, separated by the gate channel, on the cathode area K there begins an annular region of highly doped n-type material (n+) which forms the emitter. The emitter comprises circular recesses in which are embedded highly p-doped emitter shunts such as EK' and EK. The emitter shunts EK', EK are separated from the emitter by a p-doped layer surrounding each. The cathode surface formed by the emitter and the emitter shunts EK, EK' is generally designated by F; the inner edge of the cathode metallizing, which almost completely covers the cathode surface F, is represented by a chain-line M.

In all the Figures, the edge of the p+ region is indicated by a full line, the edge of the n+ region by a broken line. The edge M of the cathode metallizing, illustrated in chain line, extends somewhat outside the n+ edge.

Emitter shunts EK' of circular shape and disposed in a ring are provided in the vicinity of the gate and are at equal distances a apart—measured from the center of one shunt to the center of the adjacent shunt. The centers of these shunts EK' are disposed at a distance c from the cathode edge K adjacent the gate. These emitter shunts EK' are followed, as far as the edge of the cathode remote from the gate, by further circular emitter shunts EK which are distributed homogeneously over the cathode surface F and which are at distances b from one another—again measured from center to center—and from the emitter shunts EK'.

According to the invention, the circular emitter shunts EK' disposed in the vicinity of the gate are separated by a shorter distance a than the shunts EK provided in the cathode surface F. This distribution of the emitter shunts EK', EK is based on the knowledge that, as a result of suitable compensation of the displacement current, when an external voltage u is applied, the voltage-rise (du/dt) strength is equal at all points of the cathode area, that is to say at the cathode edge K adjacent the gate and at the cathode surface F.

In the embodiment according to FIG. 1, the spacing c between the emitter shunts EK' at the edge of the gate and the cathode edge K at the gate side amounts to about 100–500 $\mu$m. Since this spacing corresponds substantially to the width of the first turn-on channel, the shunts only slightly impede the propagation of the turn-on front. The separation a of the emitter shunts EK' close to the gate amounts at most to double the distance c, that is to say at most 200–1000 $\mu$m, so as to ensure both a homogeneous voltage-rise strength and a homogeneous turn-on capacity. The spacing b of the emitter shunts EK in the cathode surface amounts to about 1.5–5 times the spacing a, that is to say about 300–5000 $\mu$m.

Figure 3:
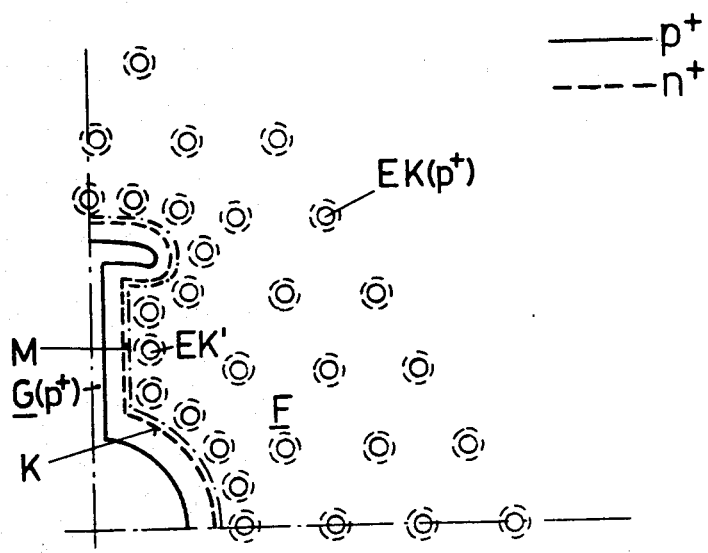
FIG. 3 shows a detail of a plan view of the gate area of a thyristor provided with a finger-shaped gate.
Figure 2:
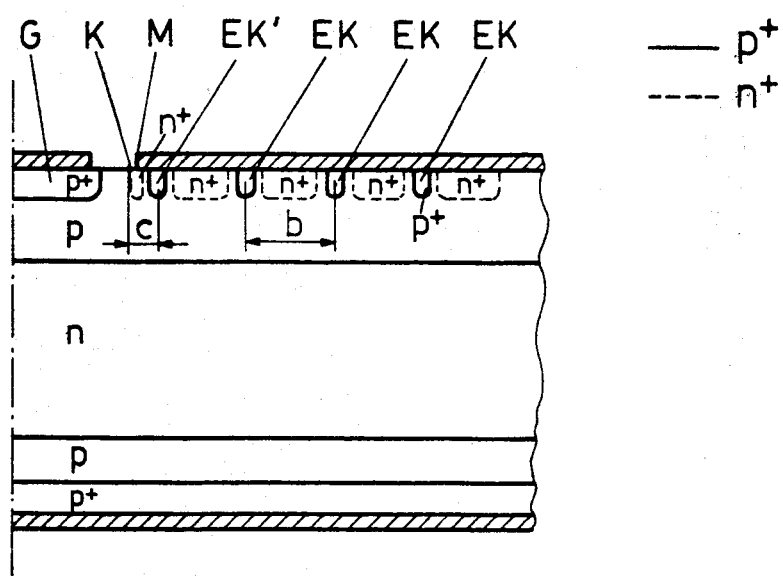
FIG. 2 shows a cross-section through the thyristor of FIG. 1 on the line A—A.

The same distribution principle can be applied not only to circular gate structures but also to those of other forms. Thus FIG. 3 shows a thyristor constructed according to the invention with a finger-shaped G' (finger gate). The application of the invention to an amplifying gate is likewise possible. In such a thyristor with internal turn-on amplification, the invention also provides an additional degree of freedom for the dimensioning of turn-on threshold and gate geometry. As a result of a voltage-rise strength which is deliberately kept low at the amplifying gate, with a uniform voltage-rise strength in the other regions of the cathode surface, a turn-on occurs in response to an excessive voltage rise at the amplifying gate so that destruction of the thyristor is avoided.

Apart from a ring of emitter shunts adjacent the gate side, a dense ring of emitter shunts at the cathode edge remote from the gate is also possible.

The emitter shunts may all have the same size and shape. Apart from the circular shape illustrated in the drawing, they may also have a polygonal shape—for example rhombic—possibly with rounded corners.

Obviously, numerous additional modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. In a thyristor having a gate and a plurality of emitter shunts distributed over the surface of a cathode, said thyristor exhibiting a first turn-on-channel corresponding to that part of the thyristor initially conducting current immediately after the application of a firing signal to said gate, where the width of the first turn-on-channel is controlled solely by gate current resulting from the application of said firing signal, the improvement comprising:

said emitter shunts provided in the immediate vicinity of the gate separated from the edge of the cathode surface adjacent the gate by a distance (c) corresponding substantially to the width of said first-turn-on-channel;

said emitter shunts provided immediately adjacent and circumferentially surrounding said gate separated by substantially equal distances (a), where the distance (a) corresponds to no more than twice said distance (c);

said emitter shunts in the cathode surface not in the vicinity of said gate separated by a distance (b) corresponding to approximately 1.5–5 times said distance (a);

wherein said distances (a), (b) and (c) are measured relative to the center of the respective shunts relating thereto.

2. A thyristor according to claim 1 further comprising:

said distance (c) corresponding substantially to the width of said first turn-on-channel lying within the range of 100–350 $\mu$m.

3. A thyristor in accordance with claim 1 wherein the distance between the emitter shunts present at the edge of the cathode remote from the gate is shorter than the distance between the emitter shunts which are disposed between the emitter shunts present at the edge of the cathode remote from the gate and the emitter shunts provided in the vicinity of the gate.

4. A thyristor in accordance with claim 1 wherein the emitter shunts have a circular or polygonal shape and are of substantially equal dimensions.

5. A thyristor in accordance with claim 1 having an amplifying gate.

* * * * *